(12) United States Patent
Cutkosky et al.

(10) Patent No.: US 9,773,969 B2
(45) Date of Patent: Sep. 26, 2017

(54) ELECTROSTRICTIVE ELEMENT MANUFACTURING METHOD

(71) Applicants: The Board of Trustees of the Leland Stanford Junior University, Palo Alto, CA (US); HONDA MOTOR CO., LTD., Tokyo (JP)

(72) Inventors: Mark R. Cutkosky, Palo Alto, CA (US); Atsuo Orita, Saitama (JP)

(73) Assignees: THE BOARD OF TRUSTEES OF THE LELAND STANFORD JUNIOR UNIVERSITY, Palo Alto, CA (US); HONDA MOTOR CO., LTD., Tokyo (JP)

(*) Notice: Subject to any disclaimer, the term of this patent is extended or adjusted under 35 U.S.C. 154(b) by 0 days.

(21) Appl. No.: 14/724,171

(22) Filed: May 28, 2015

(65) Prior Publication Data

US 2016/0351790 A1    Dec. 1, 2016

(51) Int. Cl.
| | |
|---|---|
| *B05D 1/32* | (2006.01) |
| *H01L 41/33* | (2013.01) |
| *B41F 15/00* | (2006.01) |
| *H01L 41/29* | (2013.01) |
| *H01L 41/08* | (2006.01) |
| *B05D 3/12* | (2006.01) |

(Continued)

(52) U.S. Cl.
CPC ............ *H01L 41/33* (2013.01); *B05D 1/32* (2013.01); *B41F 15/00* (2013.01); *H01L 41/08* (2013.01); *H01L 41/29* (2013.01); *B05D 3/12* (2013.01); *B05D 5/12* (2013.01); *H05K 3/1216* (2013.01)

(58) Field of Classification Search
USPC .............................. 427/98.4, 282, 100, 171
See application file for complete search history.

(56) References Cited

U.S. PATENT DOCUMENTS

| | | | |
|---|---|---|---|
| 5,014,614 A | 5/1991 | Thieme | |
| 6,376,971 B1* | 4/2002 | Pelrine | F04B 35/045 310/363 |

(Continued)

FOREIGN PATENT DOCUMENTS

| | | |
|---|---|---|
| DE | 600 37 433 | 12/2008 |
| JP | 2003-174205 | 6/2003 |

(Continued)

OTHER PUBLICATIONS

Kipphan Helmut: Handbuch der Printmedien. Berlin, Heidelberg: Springer-Verlag 2000. 442-436. Kapitel 2.4 Siebdruck.—ISBN 978-3-642-57024-7.

German Office Action dated Jan. 31, 2017 (English abstract included).

(Continued)

*Primary Examiner* — Brian K Talbot
(74) *Attorney, Agent, or Firm* — Rankin, Hill & Clark LLP

(57) ABSTRACT

Provided is a method of manufacturing an electrostrictive element by which an electrostrictive element including an expandable and contradictable film electrode having a thin and uniform thickness can be easily formed. In a method of manufacturing an electrostrictive element 1, screen printing is performed while a first jig 12 contacts with a face of a dielectric film 2 opposite to a face where screen printing is performed such that the first jig 12 surrounds an area where the screen printing is performed. Thus, a film electrode 3 is formed.

12 Claims, 6 Drawing Sheets

(51) Int. Cl.
B05D 5/12 (2006.01)
H05K 3/12 (2006.01)

(56) References Cited

U.S. PATENT DOCUMENTS

| | | | |
|---|---|---|---|
| 6,543,110 B1* | 4/2003 | Pelrine | F04B 35/045 29/25.35 |
| 2007/0132340 A1* | 6/2007 | Takeuchi | H01L 41/0946 310/323.01 |
| 2008/0224564 A1* | 9/2008 | Pelrine | C08L 75/04 310/309 |
| 2012/0169184 A1* | 7/2012 | Pelrine | H01L 41/45 310/365 |
| 2014/0290834 A1 | 10/2014 | Egron et al. | |
| 2015/0034237 A1* | 2/2015 | Biggs | H01L 41/047 156/234 |
| 2015/0200039 A1* | 7/2015 | Taguchi | C08L 21/00 310/363 |
| 2015/0320295 A1* | 11/2015 | Belson | A61B 34/30 600/141 |

FOREIGN PATENT DOCUMENTS

| | | | |
|---|---|---|---|
| JP | 2005-347364 | * | 12/2005 |
| JP | 2008-004572 | | 1/2008 |

OTHER PUBLICATIONS

German Search Report dated Jan. 27, 2017 (English abstract included).

\* cited by examiner

ELECTROSTRICTIVE ELEMENT MANUFACTURING METHOD

BACKGROUND OF THE INVENTION

Field of the Invention

The present invention relates to an electrostrictive element manufacturing method.

Description of the Related Art

Conventionally, a dielectric structure having a film electrode on a dielectric film formed of a PZT insulating film is known. Such dielectric film and film electrode are formed by patterning (see Japanese Patent Laid-Open No. 2008-4572, for example).

On the other hand, it is known that when an electrode is connected to front and rear both faces of a dielectric film formed of elastomer to apply a voltage, the dielectric film receives a compression force by Maxwell stress (inverse piezoelectric effect) by interfacial polarization caused by electrostatic power so that the dielectric film contracts in a thickness direction and stretches in a lateral direction (a direction orthogonal to the thickness direction). Recently, an electrostrictive element that includes a dielectric film and an electrode and drives in accordance with the aforementioned principle has been considered.

As an electrostrictive element having a dielectric film formed of elastomer, an electrostrictive element having a film electrode that is disposed on front and rear both faces inside an outer peripheral edge of the dielectric film and is expandable and contractible following extension and contraction of the dielectric film, and a frame that is disposed on an outer peripheral edge of one face of the dielectric film and keeps the dielectric film in a stretched state has been proposed (see Japanese Patent Laid-Open No. 2003-174205, for example).

In the electrostrictive element, when a positive or negative voltage is applied to the respective film electrodes through a collector, the dielectric film contracts in the thickness direction and stretches in the lateral direction. However, since the frame holds the outer peripheral edge of the dielectric film, outward stretching of the dielectric film is regulated and the dielectric film stretches inward. The dielectric film has an approximately mountain-like shape as a whole with a protrusion at one face side. Subsequently, the shape of the stretched dielectric film is almost restored by cancellation of the voltage application.

The film electrode is desired to have not only conductivity but also excellent elasticity to follow a stretching behavior of the dielectric film without interfering with the dielectric film stretching.

Therefore, it is conceived that in the electrostrictive element including the dielectric film formed of elastomer, the film electrode is formed by masking the dielectric film held in the stretched state and patterning a conductive material by spray coating, etc.

However, to form the film electrode having a uniform thickness by the spray coating, etc. for ensuring excellent conductivity, there is a problem that it is difficult even for a highly skilled engineer to make the film electrode thin due to flexibility or adherence of the film electrode itself. If the film electrode is thick, the elasticity cannot be ensured. Thus, the film electrode may fail to follow the stretching behavior of the dielectric film, resulting in interfering with stretching of the dielectric film or damaging the film electrode itself.

In view of the aforementioned circumstance, the object of the present invention is to provide a method of manufacturing an electrostrictive element in which the electrostrictive element having an expandable and contractible film electrode having a thin and uniform thickness can be easily formed.

SUMMARY OF THE INVENTION

To achieve the aforementioned object, the present invention provides a method of manufacturing an electrostrictive element that includes a dielectric film formed of elastomer, a film electrode formed on at least one face inside an outer peripheral edge of the dielectric film, the film electrode configured to be expandable and contractible following expansion and contraction of the dielectric film, and a frame arranged on the outer peripheral edge of at least the one face of the dielectric film, the frame configured to keep the dielectric film in a stretched state, the method comprising: a step of stretching the dielectric film formed of elastomer and keeping the dielectric film in the stretched state by arranging the frame on the outer peripheral edge of one face of the dielectric film; and a step of forming the film electrode by screen printing of a conductive paste including a conductive material on at least the one face of the dielectric film in the stretched state, wherein in the step of forming the film electrode, the screen printing is performed while a first jig contacts with a face of the dielectric film opposite to the face where the screen printing is performed such that the first jig surrounds an area where the screen printing is performed.

In the manufacturing method of the present invention, first, the dielectric film formed of elastomer is stretched, the frame is arranged on the outer peripheral edge of the one face of the dielectric film, and thus, the dielectric film is kept in the stretched state. Next, screen printing of the conductive paste including a conductive material is performed on at least the one face of the dielectric film in the stretched state, and thus, the film electrode is formed. At this time, the first jig contacts with a face of the dielectric film opposite to the face where the screen printing is performed such that the first jig surrounds the area where the screen printing is performed. Thus, the screen printing is performed while the dielectric film is in a tensed state.

In the manufacturing method of the present invention, the screen printing is performed while the first jig tenses the dielectric film, and thus, an electrostrictive element that includes the expandable and contractible film electrode having a thin and uniform thickness can be easily formed.

Furthermore, in the electrostrictive element manufacturing method of the present invention, in the step of forming the film electrode, the screen printing is performed preferably while a second jig contacts with the face of the dielectric film opposite to the face where the screen printing is performed, the second jig being disposed inside the first jig and having a shape with a gap along the outer peripheral edge having a predetermined shape corresponding to the film electrode. In such configuration, since the second jig tenses a part where the film electrode is formed in the area where the screen printing is performed, a more excellent printing surface can be obtained.

Moreover, in the electrostrictive element manufacturing method of the present invention, in the step of forming the film electrode, the screen printing is performed preferably by a third jig pressing the frame downward of the face of the dielectric film where the screen printing is performed. Since the third jig presses the frame downward, the frame is prevented from interfering with the screen printing.

Furthermore, in the electrostrictive element manufacturing method of the present invention, the respective jigs preferably have an upper end face that has a curved face bulging upward and contact with the dielectric film at a top of the curved face. Further, a contact face with the dielectric film preferably has slipperiness against the dielectric film. Such configuration can make a friction force of the dielectric film small when the respective jigs tense the dielectric film by contacting with the dielectric film. In a case where the dielectric film has an adhesive layer, the respective jigs are prevented from adhering to the adhesive layer of the dielectric film.

Moreover, in the electrostrictive element manufacturing method of the present invention, in the step of forming the film electrode, the dielectric film is preferably tensed to have a thickness of 20 to 100 µm. In such configuration, an excellent printing surface can be obtained without fail.

If the tensed dielectric film has a thickness smaller than 20 µm, the film electrode becomes dominant in mechanical rigidity, and thus, the dielectric film may not have sufficient elasticity used for an electrostrictive element. If the tensed dielectric film has a thickness larger than 100 µm, the dielectric film may not obtain desired Maxwell stress used for an electrostrictive element.

Furthermore, in the electrostrictive element manufacturing method of the present invention, in the step of keeping the dielectric film in the stretched state, a first frame as the frame may be arranged, and the manufacturing method may comprise, after the step of forming the film electrode, a step of arranging a second frame at a position outside the outer peripheral edge of the film electrode formed on the dielectric film and inside the first frame, the second frame keeping the dielectric film in the stretched state; and a step of cutting the dielectric film along an outer peripheral edge of the second frame.

Moreover, in the electrostrictive element manufacturing method of the present invention, for the dielectric film, a material including one resin material selected from a group consisting of silicone, polyurethane and polyethylene can be used.

At least one face of the dielectric film may be provided with an adhesive layer formed of an adhesive or an acrylic adhesive mainly containing the same resin material as that of the dielectric film. If so, the adhesive layer can provide good adhesion of the film electrode to the dielectric film. Further, since the adhesive layer has elasticity and a relative dielectric constant that are equal to or more than those of the resin material of the dielectric film, the adhesive layer does not block the elasticity and relative dielectric constant of the dielectric film.

As the conductive material, for example, any one of a platinum carrying carbon material, silver and copper can be used.

As the frame, one resin material selected from a group consisting of ABS (acrylonitrile butadiene styrene copolymer), polyacetal, polyetherketone and glass reinforced resin or one inorganic material selected from a group consisting of reinforced glass and ceramics having a compression layer on a face can be used.

DETAILED DESCRIPTION OF THE REFERRED EMBODIMENTS

Figure 1:
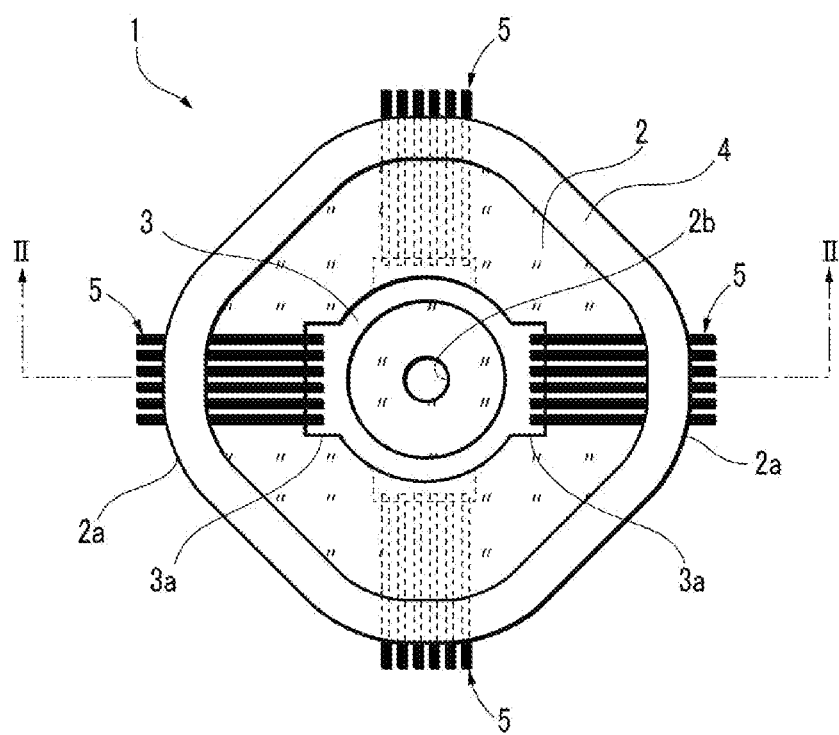
FIG. 1 is a plan view of an electrostrictive element manufactured by a manufacturing method of an embodiment of the present invention.
Figure 2:
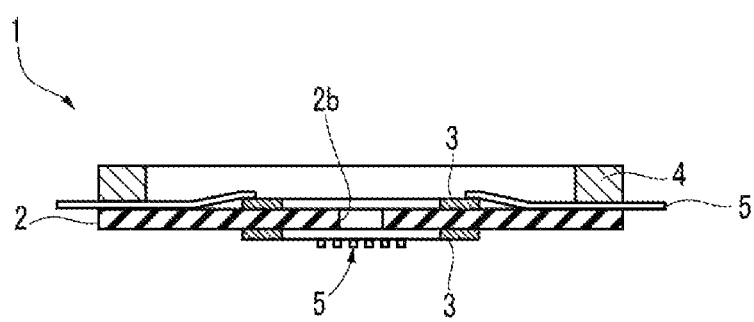
FIG. 2 is a cross-sectional view taken along line II-II in FIG. 1.

An electrostrictive element 1 illustrated in FIG. 1 and FIG. 2 includes a dielectric film 2 formed of elastomer, film electrodes 3 formed inside outer peripheral edges on both front and rear faces of the dielectric film 2, a frame 4 keeping the dielectric film 2 in a stretched state, and a collector 5 supplying power to the film electrode 3.

The dielectric film 2 having round corners 2a and a through hole 2b at the center thereof has an approximately square shape. However, the dielectric film 2 may have an annular shape instead of an approximately square shape.

The film electrode 3, which has an annular shape, has two protrusions 3a that are a part facing the corner 2a of the dielectric film 2 and protrude outward. The film electrode 3 is formed to have a thickness of e.g., 8 to 50 µm by screen printing, as described later. The film electrode 3 formed on an upper face side of the dielectric film 2 has the protrusion 3a extending in a horizontal direction in FIG. 1. The film electrode 3 formed on a lower face side of the dielectric film 2 has the protrusion 3a extending in a vertical direction in FIG. 1.

The frame 4 is formed of an insulating material such as ABS, polyacetal, polyetherketone, glass reinforced resin or the like. By adhering to the outer peripheral edge of one face of the dielectric film 2, the frame 4 keeps the dielectric film 2 stretched.

Next, a method of manufacturing the electrostrictive element 1 will be described.

First Embodiment

Figure 3A:
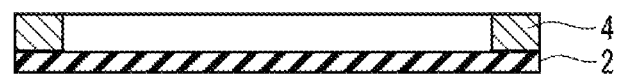
FIG. 3A illustrates a step of keeping a dielectric film in a stretched state.

First, as illustrated in FIG. 3A, the frame 4 is arranged on the outer peripheral edge of the upper face of the dielectric film 2 formed of elastomer. The frame 4 keeps the dielectric film 2 in a stretched state.

As the elastomer used for the dielectric film 2, for example, a resin material including silicone, polyurethane and polyethylene may be used. Such elastomer may further include a dielectric substance such as barium titanate to adjust a dielectric constant of the dielectric film 2. One or both faces of the resin material may be provided with an adhesive layer formed of an adhesive or an acrylic adhesive mainly containing a same resin material as that of the dielectric film 2. The present embodiment uses a sheet made of a polyethylene film having an adhesive layer of an acrylic adhesive (3M, the product name: VHB4910 (thickness: 1000 μm), or the product name: VHB4905 (thickness: 500 μm)). In the present embodiment, the frame 4 is arranged on a face at a side of the adhesive layer of the dielectric film 2.

Figure 3B:
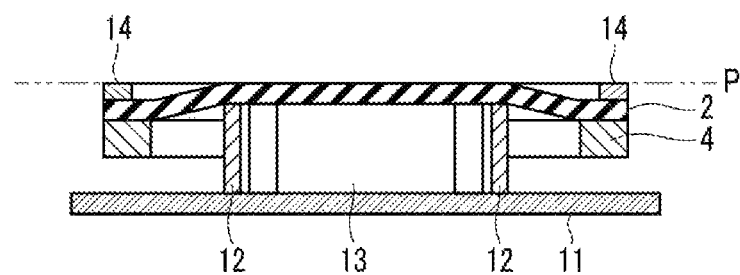
FIG. 3B illustrates a step of performing screen printing on the dielectric film.

Next, as illustrated in FIG. 3B, a first jig 12 that is smaller than an inner periphery of the frame 4 and larger than the film electrode 3 formed on the dielectric film 2 erects on a working table 11. Inside the first jig 12, two second jigs 13 facing each other erect.

Figure 4A:
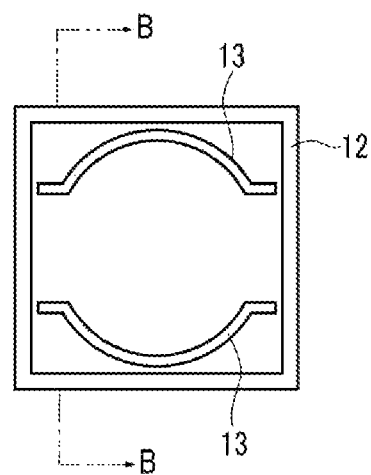
FIG. 4A is a plan view of a first jig.
Figure 4B:
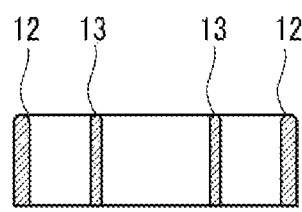
FIG. 4B is a cross-sectional view taken along line B-B in FIG. 4A.

As illustrated in FIG. 4A, the first jig 12 has a rectangular frame shape that is smaller than the inner periphery of the frame 4 and larger than the film electrode 3 formed on the dielectric film 2. The second jig 13 has an approximately Ω shape. When erecting inside the first jig 12, the second jig 13 is slightly larger than an outer peripheral edge having a predetermined shape corresponding to the film electrode 3 (in the present embodiment, a shape having two protrusions protruding in the horizontal direction in FIG. 1 at the annular outer peripheral edge). As illustrated in FIG. 4B, the first jig 12 and the second jigs 13 have an upper end face that has a curved face bulging upward. A masking tape (not illustrated) having slipperiness against the dielectric film 2 is attached to the upper end face.

Subsequently, as illustrated in FIG. 3B, the dielectric film 2 with the adhesive layer to which the frame 4 is adhered is reversed so that the frame 4 faces the working table 11. The dielectric film 2 is placed on the upper end of the first jig 12 and the second jigs 13. At this time, the first jig 12 and the second jigs 13 contact with the dielectric film 2 at a top of the curved face.

In this way, the first jig 12 and the second jigs 13 stretch an area of the dielectric film 2 where screen printing is to be performed such that the area has a thickness of 20 to 100 μm. Thus, the area is tensed. Since the first jig 12 and the second jigs 13 contact with the dielectric film 2 at the top of the upper end face and the masking tape is attached to the upper end face, a friction force of the dielectric film 2 can be made small and the first jig 12 and the second jigs 13 can be prevented from adhering to the adhesive layer.

Subsequently, a third jig 14 having an inner periphery larger than that of the frame 4 is placed on the frame 4. The third jig 14 is pressed downward to position the frame 4 below the upper face of the dielectric film 2 disposed on the first jig 12 and the second jigs 13. Accordingly, a printing surface P for screen printing is formed on the upper face of the dielectric film 2 and the frame 4 is prevented from positioning above the printing surface P and interfering with the screen printing.

In this state, a screen (not illustrated) with a pattern having a predetermined shape corresponding to the film electrode 3 formed (in the present embodiment, a shape having two protrusions protruding in the horizontal direction in FIG. 3B at annular outer peripheral edges) is provided on the printing surface P. A conductive paste including a conductive material is used as ink. Thus, the screen printing is performed. As the conductive paste including a conductive material, for example, silicone including any one of a platinum carrying carbon material, silver and copper can be used.

Figure 3C:
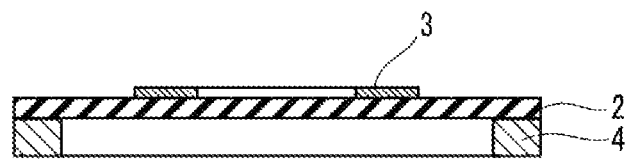
FIG. 3C illustrates the dielectric film on one face of which screen printing has been performed.

At this time, since the area of the dielectric film 2 where the screen printing is to be performed stretches to a tensed state, an excellent printing surface can be obtained without fail. As a result of the screen printing, as illustrated in FIG. 3C, the film electrode 3 having a thickness of, e.g., 8 to 50 μm is formed on a face opposite to the frame 4 of the dielectric film 2 held in a stretched state.

Figure 5A:
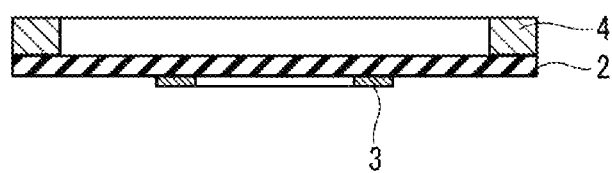
FIG. 5A illustrates the dielectric film on one face of which screen printing has been performed.
Figure 5B:
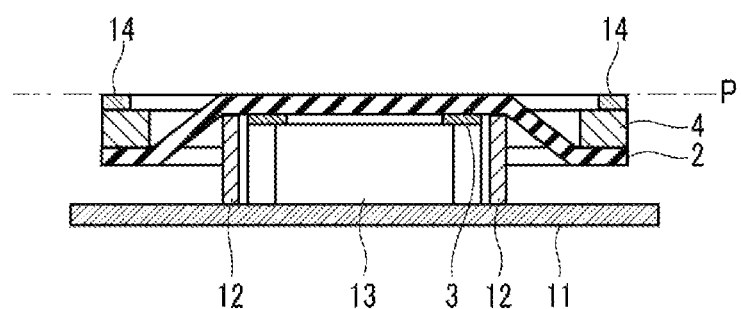
FIG. 5B illustrates a step of performing screen printing on the dielectric film.

Subsequently, as illustrated in FIG. 5A, front and rear of the dielectric film 2 having the film electrode 3 formed on a face at the frame 4 side are reversed to rotate by 90 degrees. Then, as illustrated in FIG. 5B, the dielectric film 2 is placed on the upper end of the first jig 12 and the second jigs 13. Thus, the area of the dielectric film 2 where the screen printing is to be performed is stretched to enter a tensed state by the first jig 12 and the second jigs 13. At this time, the film electrode 3 printed on the dielectric film 2 enters a gap between the two second jigs 13. Thus, the first jig 12 and the second jigs 13 do not damage the film electrode 3.

Subsequently, the third jig 14 is placed on the outer peripheral edge of the dielectric film 2, the third jig 14 is pressed downward, and thus, the frame 4 is positioned below the upper face of the dielectric film 2 which is disposed on the first jig 12 and the second jigs 13. Consequently, a printing surface P for screen printing is formed on the upper face of the dielectric film 2.

Figure 5C:
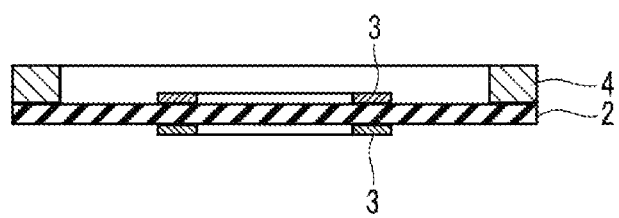
FIG. 5C illustrates the dielectric film on both faces of which screen printing has been performed.

In this state, the screen is provided on the printing surface P and the conductive paste is used as ink so that the screen printing is performed. As a result, as illustrated in FIG. 5C, the respective film electrodes 3 having a thickness of, e.g., 8 to 50 μm are formed on the both faces of the dielectric film 2 held in a stretched state.

Subsequently, the through hole 2b is formed at the center of the dielectric film 2 having both of the front and rear faces on which the film electrode 3 is formed. Thereafter, the collector 5 is connected to the outer peripheral edge of the protrusion 3a of each film electrode 3.

In the aforementioned way, the electrostrictive element 1 illustrated in FIG. 1 can be formed.

In the manufacturing method of the present embodiment, the screen printing is performed while the dielectric film 2 is tensed by the first jig 12 and the second jigs 13. Thus, the electrostrictive element 1 having the expandable and contradictable film electrode 3 having a thin and uniform thickness can be easily formed.

Second Embodiment

Next, a second embodiment will be described. A part same as that in the first embodiment is denoted by the same reference number, and the description thereof will be omitted.

Figure 6A:
FIG. 6A illustrates a step of keeping a dielectric film in a stretched state.

First, as illustrated in FIG. 6A, a working frame 21 as a first frame is arranged on the outer peripheral edge of an upper face (at the adhesive layer side) of the dielectric film 2 formed of elastomer. The working frame 21 keeps the dielectric film 2 stretched. The dielectric film 2 in the present embodiment, which differs from the dielectric film 2 in the manufacturing method of the first embodiment, is larger than the electrostrictive element 1 to be manufactured.

Figure 6B:
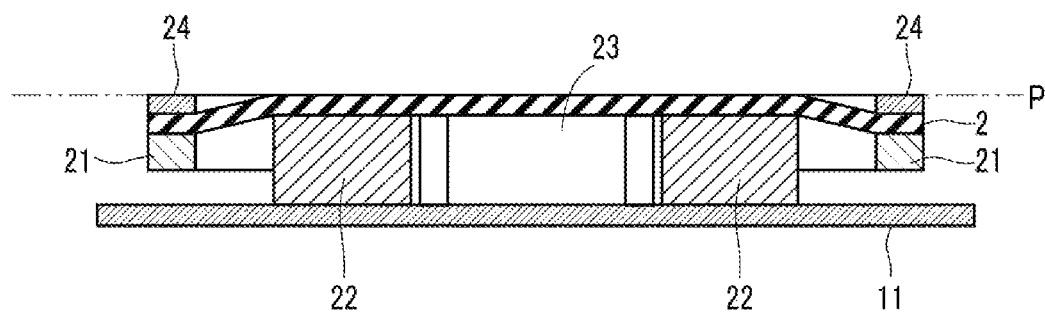
FIG. 6B illustrates a step of performing screen printing on the dielectric film.

Subsequently, as illustrated in FIG. 6B, a first jig 22 that is smaller than an inner periphery of the working frame 21 and larger than the film electrode 3 formed on the dielectric film 2 erects on the working table 11 and two second jigs 23 facing each other erect inside the first jig 22. The first jig 22 has a similar shape as the first jig 12 except that the first jig 22 has a larger outer periphery than the first jig 12. The second jigs 23 have a similar shape as the second jigs 13.

Subsequently, the dielectric film 2 having the adhesive layer to which the working frame 21 is adhered is reversed to face the working table 11 and the dielectric film 2 is placed at the upper end of the first jig 22. Thus, the area of the dielectric film 2 where screen printing is to be performed is stretched to enter a tensed state by the first jig 22 and the second jigs 23 such that the area has a thickness of 20 to 100

μm. Further, a third jig 24 that has a larger inner periphery than the inner periphery of the working frame 21 is placed on the working frame 21, and the third jig 24 is pressed downward. Thus, the working frame 21 is positioned below the upper face of the dielectric film 2 which is disposed on the first jig 22 and the second jigs 23. Consequently, a printing surface P for screen printing is formed on the upper face of the dielectric film 2.

In this state, the screen with the pattern formed is provided on the printing surface P so that screen printing is performed.

Figure 6C:
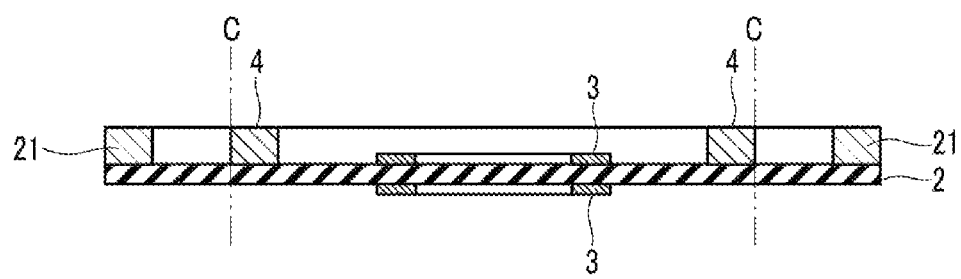
FIG. 6C illustrates the dielectric film on both faces of which screen printing has been performed.

Subsequently, front and rear of the dielectric film 2 having a face at the working frame 21 side on which the film electrode 3 is formed are reversed to rotate by 90 degrees. Then, the dielectric film 2 is placed on the upper end of the first jig 22 and the second jigs 23. Subsequently, the third jig 24 is placed on the outer peripheral edge of the dielectric film 2, the third jig 24 is pressed downward, and thus, the frame 4 is positioned below the upper face of the dielectric film 2 which is disposed on the first jig 22 and the second jigs 23 so that a printing surface P for screen printing is formed. In this state, the screen is provided on the printing surface P having the pattern formed to perform the screen printing. As a result, as illustrated in FIG. 6C, the film electrodes 3 having a thickness of, e.g., 8 to 50 μm are formed on the both faces of the stretched dielectric film 2 in a tensed state.

Subsequently, to a position outside the outer peripheral edge of the film electrode 3 formed on the dielectric film 2, the frame 4 as a second frame is adhered. The frame 4 is identical to the frame 4 in the manufacturing method of the first embodiment. Then, the dielectric film 2 is cut along the outer peripheral edge of the frame 4 at a position of a virtual line C in the drawing. As a result, as illustrated in FIG. 6C, on both faces of the stretched dielectric film 2 in a tensed state, the respective film electrodes 3 having a thickness of, e.g., 8 to 50 μm are formed.

Subsequently, the through hole 2b is formed at the center of the dielectric film 2 having both of the front and rear faces on which the film electrode 3 is formed. Thereafter, the collector 5 is connected to the outer peripheral edge of the protrusion 3a of each film electrode 3. Thus, the electrostrictive element 1 illustrated in FIG. 1 can be formed.

REFERENCE SIGN LIST

1 . . . Electrostrictive element, 2 . . . Dielectric film, 3 . . . Film electrode, 4 . . . Frame, Second frame, 5 . . . Collector, 12, 22 . . . First jig, 13, 23 . . . Second jig, 14, 24 . . . Third jig, 21 . . . First frame

What is claimed is:

1. A method of manufacturing an electrostrictive element that includes a dielectric film formed of elastomer, a film electrode formed on at least one face inside an outer peripheral edge of the dielectric film, the film electrode configured to be expandable and contractible following expansion and contraction of the dielectric film, and a frame arranged on the outer peripheral edge of at least the one face of the dielectric film, the frame configured to keep the dielectric film in a stretched state, the method comprising:
  a step of stretching the dielectric film formed of elastomer and keeping the dielectric film in the stretched state by arranging the frame on the outer peripheral edge of one face of the dielectric film; and
  a step of forming the film electrode by screen printing of a conductive paste including a conductive material on at least the one face of the dielectric film in the stretched state,
  wherein in the step of forming the film electrode, the screen printing is performed: while a first jig contacts with a face of the dielectric film opposite to the face where the screen printing is performed such that the first jig surrounds an area where the screen printing is performed; while a second jig contacts with the face of the dielectric film opposite to the face where the screen printing is performed, the second jig being disposed inside the first jig and having a shape with a gap along the outer peripheral edge having a predetermined shape corresponding to the film electrode; and by a third jig pressing the frame downward of the face of the dielectric film where the screen printing is performed,
  wherein the first jig is detached from the dielectric film after the step of forming the film electrode.

2. The method of manufacturing the electrostrictive element of claim 1, wherein the first jig has an upper end face that has a curved face bulging upward, and the first jig contacts with the dielectric film at a top of the curved face.

3. The method of manufacturing the electrostrictive element of claim 1, wherein a contact face of the first jig with the dielectric film has slipperiness against the dielectric film.

4. The method of manufacturing the electrostrictive element of claim 1, wherein in the step of forming the film electrode, the dielectric film is tensed to have a thickness of 20 to 100 μm.

5. The method of manufacturing the electrostrictive element of claim 1, wherein in the step of keeping the dielectric film in the stretched state, a first frame as the frame is arranged, and after the step of forming the film electrode, the method comprises:
  a step of arranging a second frame at a position outside the outer peripheral edge of the film electrode formed on the dielectric film and inside the first frame, the second frame keeping the dielectric film in the stretched state; and
  a step of cutting the dielectric film along an outer peripheral edge of the second frame.

6. The method of manufacturing the electrostrictive element of claim 1, wherein the dielectric film includes one type of resin material selected from a group consisting of silicone, polyurethane and polyethylene.

7. The method of manufacturing the electrostrictive element of claim 6, wherein at least one face of the dielectric film is provided with an adhesive layer formed of an adhesive or an acrylic adhesive mainly containing the same resin material as the resin material of the dielectric film.

8. The method of manufacturing the electrostrictive element of claim 1, wherein the conductive material is any one of a platinum carrying carbon material, silver and copper.

9. The method of manufacturing the electrostrictive element of claim 1, wherein the frame is formed of one type of resin material selected from a group consisting of ABS (acrylonitrile butadiene styrene copolymer), polyacetal, polyetherketone and glass reinforced resin or one type of inorganic material selected from a group consisting of reinforced glass and ceramics having a compression layer on a face.

10. The method of manufacturing the electrostrictive element of claim 1, wherein the first and second jigs have an upper end face that has a curved face bulging upward, and the first and second jigs contact with the dielectric film at a top of the curved face.

11. The method of manufacturing the electrostrictive element of claim 1, wherein a contact face of the first and second jigs with the dielectric film has slipperiness against the dielectric film.

12. The method of manufacturing the electrostrictive element of claim 1, wherein the first jig is surrounded by the outer peripheral edge of the dielectric film.

\* \* \* \* \*